US012653007B2

(12) United States Patent
Bao et al.

(10) Patent No.: US 12,653,007 B2
(45) Date of Patent: Jun. 9, 2026

(54) DIRECT N/P LOCAL INTERCONNECT

(71) Applicant: QUALCOMM Incorporated, San Diego, CA (US)

(72) Inventors: Junjing Bao, San Diego, CA (US); Haining Yang, San Diego, CA (US); Ming-Huei Lin, New Taipei City (TW)

(73) Assignee: QUALCOMM Incorporated, San Diego, CA (US)

( * ) Notice: Subject to any disclaimer, the term of this patent is extended or adjusted under 35 U.S.C. 154(b) by 394 days.

(21) Appl. No.: 18/327,786

(22) Filed: Jun. 1, 2023

(65) Prior Publication Data

US 2024/0404872 A1 Dec. 5, 2024

(51) Int. Cl.
| | |
|---|---|
| *H01L 29/76* | (2006.01) |
| *H01L 21/762* | (2006.01) |
| *H01L 21/768* | (2006.01) |
| *H01L 23/532* | (2006.01) |
| *H01L 29/94* | (2006.01) |
| *H10D 62/10* | (2025.01) |
| *H10D 84/01* | (2025.01) |
| *H10D 84/03* | (2025.01) |
| *H10D 84/83* | (2025.01) |

(52) U.S. Cl.
CPC .. *H01L 21/76224* (2013.01); *H01L 21/76831* (2013.01); *H01L 23/53257* (2013.01); *H10D 62/115* (2025.01); *H10D 84/0151* (2025.01); *H10D 84/038* (2025.01); *H10D 84/83* (2025.01)

(58) Field of Classification Search
CPC ......... H01L 21/76224; H01L 21/76831; H01L 23/53257; H01L 21/76807; H01L 21/76895; H01L 21/76897; H10D 62/115; H10D 84/0151; H10D 84/038; H10D 84/83; H10D 84/0186
USPC .......................................................... 257/401
See application file for complete search history.

(56) References Cited

U.S. PATENT DOCUMENTS

| | | | |
|---|---|---|---|
| 9,728,454 B1 | 8/2017 | Zhou et al. | |
| 11,081,403 B2 | 8/2021 | Lin et al. | |
| 2016/0172357 A1* | 6/2016 | Song | H01L 23/485 |
| | | | 257/401 |
| 2021/0074819 A1* | 3/2021 | Wang | H10D 84/0193 |

OTHER PUBLICATIONS

International Search Report and Written Opinion—PCT/US2024/024586—ISA/EPO—Sep. 23, 2024.

* cited by examiner

*Primary Examiner* — Theresa T Doan
(74) *Attorney, Agent, or Firm* — Muncy, Geissler, Olds & Lowe, P.C./Qualcomm

(57) ABSTRACT

Disclosed are devices that include a direct N/P local interconnect with minimal recess on shallow trench isolation (STI) oxide. This reduces undesirable coupling capacitance with active gate, which in turn improves AC performance of the device. Pull or even partial replacement of STI oxide with low-k dielectric can further reduce coupling capacitance.

21 Claims, 17 Drawing Sheets

500

340

345

360

330

547

335

500

395

345     340

392

397

370     380

310     320

375     385

330

547

335

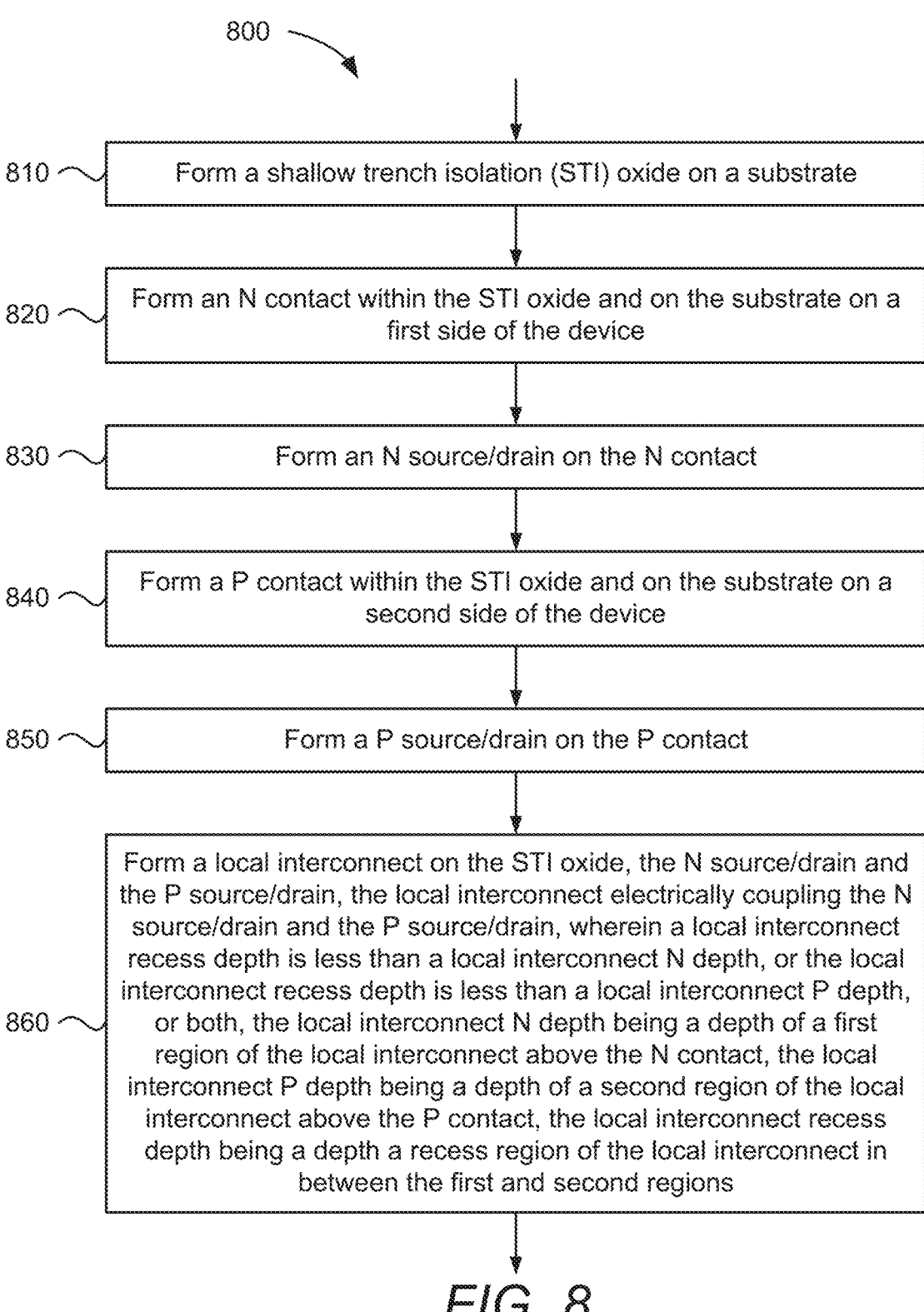

800

810 — Form a shallow trench isolation (STI) oxide on a substrate

820 — Form an N contact within the STI oxide and on the substrate on a first side of the device 830 — Form an N source/drain on the N contact 840 — Form a P contact within the STI oxide and on the substrate on a second side of the device 850 — Form a P source/drain on the P contact 860 — Form a local interconnect on the STI oxide, the N source/drain and the P source/drain, the local interconnect electrically coupling the N source/drain and the P source/drain, wherein a local interconnect recess depth is less than a local interconnect N depth, or the local interconnect recess depth is less than a local interconnect P depth, or both, the local interconnect N depth being a depth of a first region of the local interconnect above the N contact, the local interconnect P depth being a depth of a second region of the local interconnect above the P contact, the local interconnect recess depth being a depth a recess region of the local interconnect in between the first and second regions

*FIG. 8*

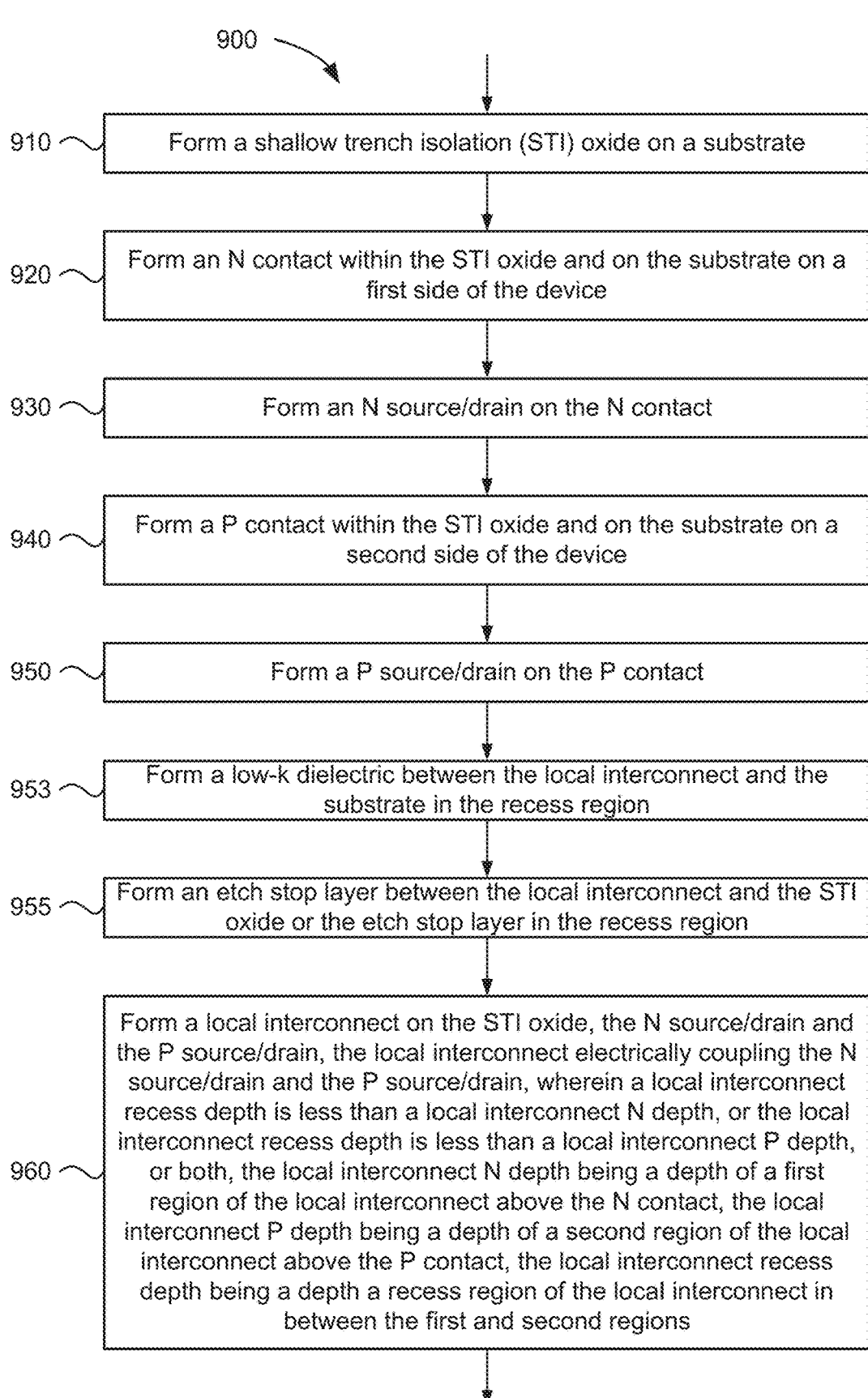

900

910 — Form a shallow trench isolation (STI) oxide on a substrate

920 — Form an N contact within the STI oxide and on the substrate on a first side of the device 930 — Form an N source/drain on the N contact 940 — Form a P contact within the STI oxide and on the substrate on a second side of the device 950 — Form a P source/drain on the P contact 953 — Form a low-k dielectric between the local interconnect and the substrate in the recess region 955 — Form an etch stop layer between the local interconnect and the STI oxide or the etch stop layer in the recess region 960 — Form a local interconnect on the STI oxide, the N source/drain and the P source/drain, the local interconnect electrically coupling the N source/drain and the P source/drain, wherein a local interconnect recess depth is less than a local interconnect N depth, or the local interconnect recess depth is less than a local interconnect P depth, or both, the local interconnect N depth being a depth of a first region of the local interconnect above the N contact, the local interconnect P depth being a depth of a second region of the local interconnect above the P contact, the local interconnect recess depth being a depth a recess region of the local interconnect in between the first and second regions

FIG. 9

DIRECT N/P LOCAL INTERCONNECT

FIELD OF DISCLOSURE

This disclosure relates generally to semiconductor devices, and more specifically, but not exclusively, to semiconductor devices with direct N region and P region (N/P) local interconnect scheme, and fabrication techniques thereof.

BACKGROUND

Integrated circuit (IC) technology has achieved great strides in advancing computing power through miniaturization of active components. A direct local interconnect can be desirable in that it can reduce effective resistance. It can provide additional current paths to relieve electrical stress (e.g., electromigration), which can thus reduce current density. Unfortunately, excessive recess on a shallow trench isolation (STI) oxide can cause high coupling capacitance with active, which can thereby significantly degrade AC performance.

Accordingly, there is a need for systems, apparatus, and methods that overcome the deficiencies of conventional devices including the methods, system and apparatus provided herein.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

An exemplary device is disclosed. The device may comprise a shallow trench isolation (STI) oxide formed on a substrate. The device may also comprise an N contact formed within the STI oxide and on the substrate on a first side of the device. The device may further comprise an N source/drain formed on the N contact. The device may yet comprise a P contact formed within the STI oxide and on the substrate on a second side of the device. The device may yet further comprise a P source/drain formed on the P contact. The device may in addition comprise a local interconnect formed on the STI oxide, the N source/drain, and the P source/drain. The local interconnect may electrically couple the N source/drain and the P source/drain. A local interconnect recess depth may be less than a local interconnect N depth. Alternatively, or in addition thereto, the local interconnect recess depth may be less than a local interconnect P depth. The local interconnect N depth may be a depth of a first region of the local interconnect above the N contact. The local interconnect P depth may be a depth of a second region of the local interconnect above the P contact. The local interconnect recess depth may be a depth of a recess region of the local interconnect in between the first and second regions.

A method of fabricating a device is disclosed. The method may comprise forming a shallow trench isolation (STI) oxide on a substrate. The method may also comprise forming an N contact within the STI oxide and on the substrate on a first side of the device. The method may further comprise forming an N source/drain on the N contact. The method may yet comprise forming a P contact within the STI oxide and on the substrate on a second side of the device. The method may yet further comprise forming a P source/drain on the P contact. The method may in addition comprise forming a local interconnect on the STI oxide, the N source/drain, and the P source/drain. The local interconnect may electrically couple the N source/drain and the P source/drain. A local interconnect recess depth may be less than a local interconnect N depth. Alternatively, or in addition thereto, the local interconnect recess depth may be less than a local interconnect P depth. The local interconnect N depth may be a depth of a first region of the local interconnect above the N contact. The local interconnect P depth may be a depth of a second region of the local interconnect above the P contact. The local interconnect recess depth may be a depth of a recess region of the local interconnect in between the first and second regions.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

FIGS. 7A-7I illustrate examples of stages of fabricating a device of FIGS. 4A, 4B, 5A and 5B in accordance with at one or more aspects of the disclosure.

FIGS. 8-9 illustrate flow charts of example methods of manufacturing devices with local interconnects in accordance with at one or more aspects of the disclosure.

Figure 1:
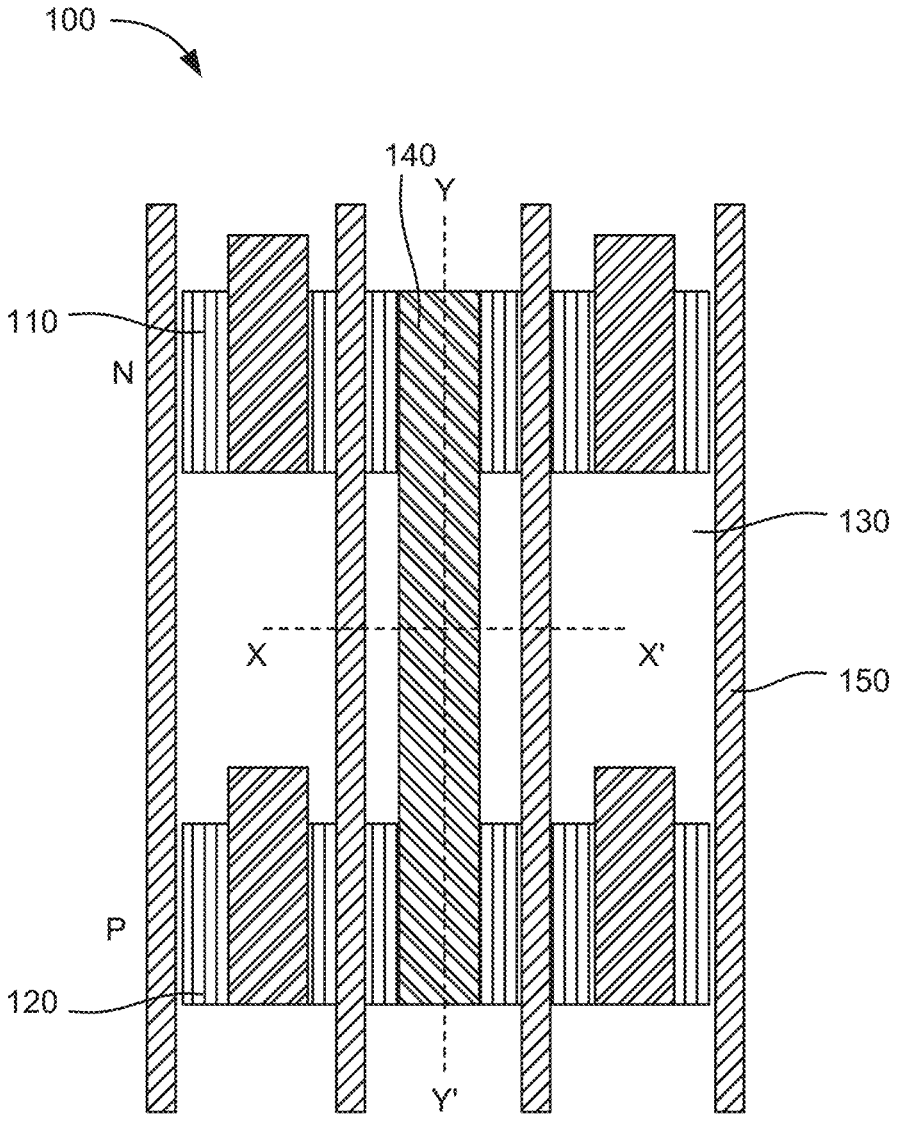
FIG. 1 illustrates a top view of a device with a local interconnect.

Other objects and advantages associated with the aspects disclosed herein will be apparent to those skilled in the art based on the accompanying drawings and detailed description. In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises." "comprising." "includes," and/or "including," when used herein, specify the presence of stated features, integers, steps, operations, elements, and/or components, but do not preclude the presence or addition of one or more other features, integers, steps, operations, elements, components, and/or groups thereof.

As indicated above, excessive recess on the STI oxide can cause undesirable high coupling capacitance with the active gates, and thus can degrade performance. FIG. 1 illustrates a top view of a cell of a device with a local interconnect. The device cell 100 includes an N field effect transistor (FET) region 110, a P FET region 120, all covered with STI oxide 130. There are also a plurality of fins 150 extending in perpendicular directions to the N and P FET regions 110, 120. A local interconnect 140 connects the N and P FET regions 110, 120.

Figure 2A:
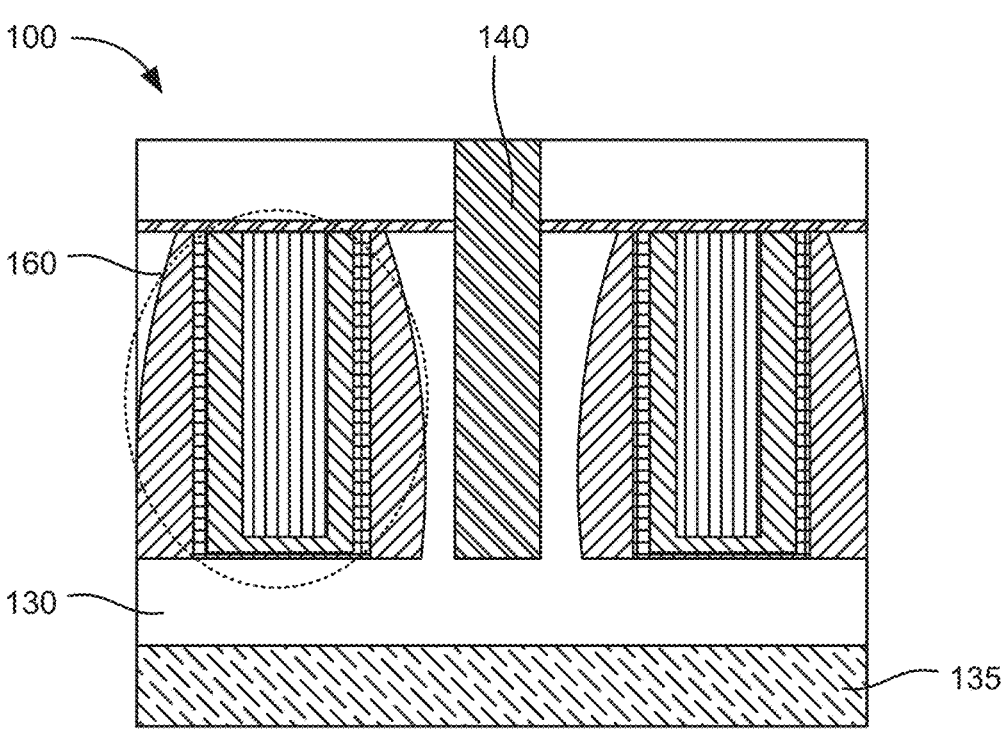
FIGS. 2A and 2B illustrate sectional views of a conventional device with a local interconnect along the line X-X' and Y-Y' of FIG. 1, respectively.

FIG. 2A illustrates a sectional view of a conventional device 100 along the line X-X' of FIG. 1. As seen, STI oxide 130 is formed on a silicon (Si) substrate 135. A local interconnect 140 is formed in the STI oxide 130 above the Si substrate 135. Gate structures 160 are formed on both sides of the local interconnect 140.

Figure 2B:
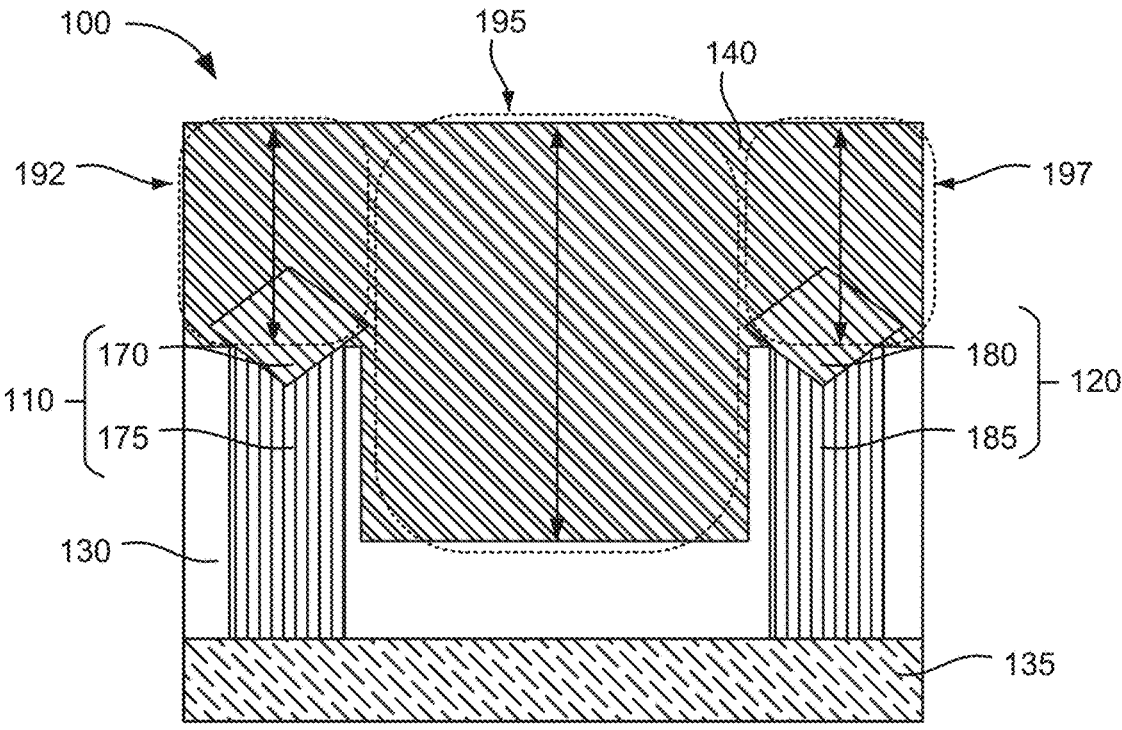

FIG. 2B illustrates a sectional view of the conventional device 100 along the line Y-Y' of FIG. 1. As seen, on one side of device 100 (e.g., left side), an N contact 175 is formed within the STI oxide 130 and on the substrate 135, and an N source/drain 170 is formed on the N contact 175. In this instance, the N contact 175 and the N source/drain 170 are assumed to parts of the N FET region 110. On another side of device 100 (e.g., right side), a P contact 185 is formed within the STI oxide 130 and on the substrate 135, and a P source/drain 180 is formed on the P contact 185. The P contact 185 and the P source/drain 180 are assumed to parts of the P FET region 120.

The local interconnect 140 is formed on the STI oxide 130, the N source/drain 170 and the P source/drain 180. The local interconnect 140 electrically connects the N source/drain 170) and the P source/drain 180 with each other. For case of description, the local interconnect 140 is divided into three regions—first region 192, second region 197, and a recess region 195. The first region 192 is defined to be a region of the local interconnect 140 above the N contact 175. The second region 197 is defined to be a region of the local interconnect 140 above the P contact 185. The recess region 195 is defined to be a region of the local interconnect 140 between the first and second regions 192, 197. With the regions so defined, the local interconnect 140 seen in FIG. 2A is the recess region 195 of the local interconnect 140.

Note that with the conventional device 100, the depth of the local interconnect 140 in the recess region 195 is greater than the depth of the local interconnect 140 in both the first region 192 and the second region 197. As mentioned, this can cause excessive capacitive coupling, which in turn can degrade AC performance.

Figure 3A:
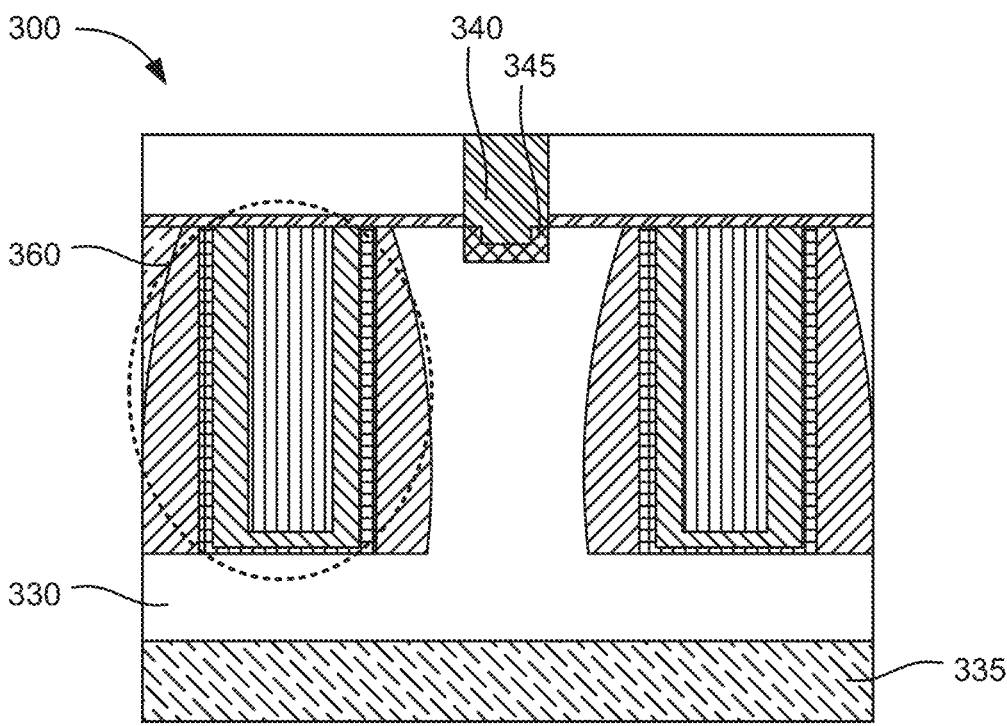
FIGS. 3A and 3B illustrate sectional views of an embodiment of a device with a local interconnect along the line X-X' and Y-Y' of FIG. 1, respectively, in accordance with at one or more aspects of the disclosure.
Figure 3B:
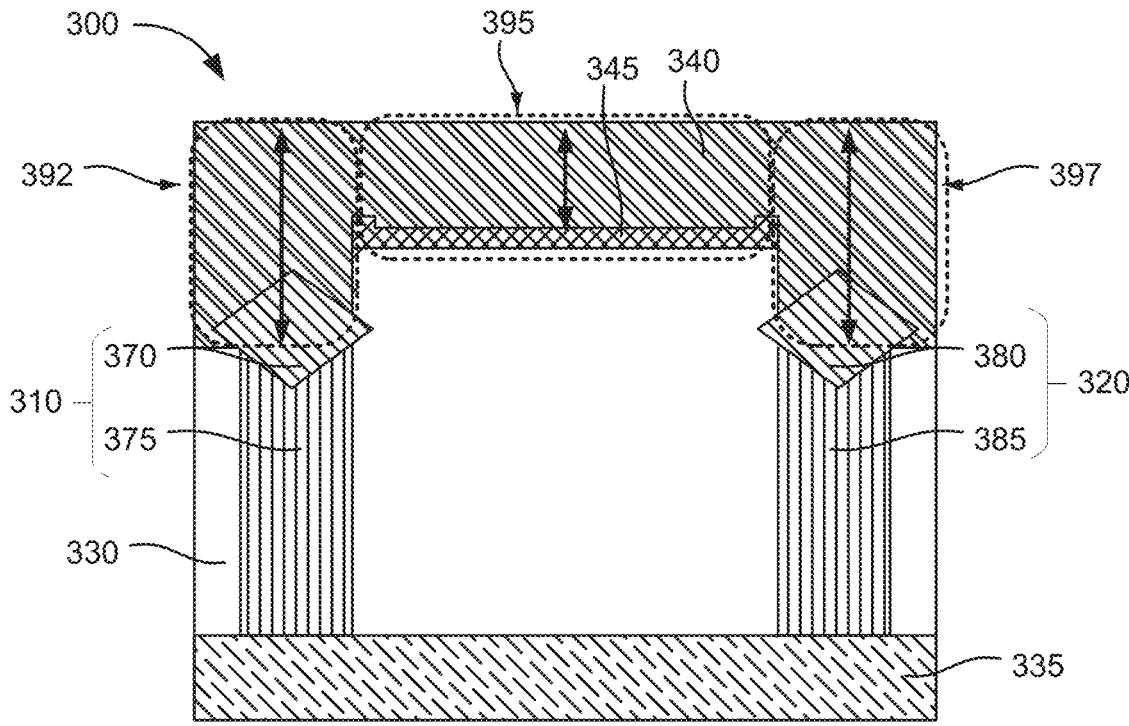

To address these and other issues of the conventional device, it is proposed to provide devices with local interconnects with significantly reduced recesses, which can significantly reduce the undesirable capacitive coupling. FIGS. 3A and 3B illustrate sectional views of a device 300 with a local interconnect in accordance with at one or more aspects of the disclosure. FIG. 3A illustrates a sectional view of the device 300 along the line X-X' of FIG. 1. As seen, an STI oxide 330 may be formed on a substrate 335. The substrate 335 may be a silicon (Si) substrate. A local interconnect 340 may be formed in the STI oxide 330 above the substrate 335. Gate structures 360 may be formed on both sides of the local interconnect 340. Heights of the gate structures 360 may be between 50-100 nm.

FIG. 3B illustrates a sectional view of the device 300 along the line Y-Y' of FIG. 1. On a first side of the device 300 (e.g., left side), an N contact 375 may be formed within the STI oxide 330 and on the substrate 335, and an N source/drain 370 may be formed on the N contact 375. In an aspect, the N source/drain 370 may be an epitaxial source/drain. The N contact 375 and the N source/drain 370 may be assumed to parts of the N FET region 310. On another side—a second side—of the device 300 (e.g., right side), a P contact 385 may be formed within the STI oxide 330 and on the substrate 335, and a P source/drain 380 may be formed on the P contact 385. In an aspect, the P source/drain 380 may be an epitaxial source/drain. The P contact 385 and the P source/drain 380 may be assumed to parts of the P FET region 320.

As seen in both FIGS. 3A and 3B, an etch stop layer 345 may be formed between the local interconnect 340 and the STI oxide 330. The etch stop layer 345 may be formed from materials such as silicon nitride (SiN), silicon carbon nitride (SiCN), aluminum nitride (AlN), aluminum oxide ($Al_2O_3$), etc. In an aspect, the etch stop layer 345 may be in direct contact with the local interconnect 340. Also as seen in both FIGS. 3A and 3B, the etch stop layer 345 is seen as being 'U' shaped. However, this is not a requirement. The etch stop layer 345 may be 'U' shaped in only one direction (e.g., in X-X' direction or in Y-Y' direction). Alternatively, the etch stop layer 345 may be of uniform height throughout. The height of the etch stop layer 345 at the edges (e.g., when it is 'U' shaped) may be in the range between 1-5 nm.

The local interconnect 340 may be formed on the STI oxide 330, the N source/drain 370 and the P source/drain 380. The local interconnect 340 may electrically couple the N source/drain 370 and the P source/drain 380 with each other. For example, the local interconnect 340 may be direct contact with one or both of the N source/drain 370 and the P source/drain 380. As such, N contact 375 and the P contact 385 may be electrically coupled to each other through the local interconnect 340. The local interconnect 340 may be formed from materials such as tungsten (W), cobalt (Co), ruthenium (Ru), nickel (Ni), niobium (Nb), etc.

For ease of description, the local interconnect 340 may be divided into three regions-first region 392, second region 397, and a recess region 395. The first region 392 may be defined to be a region of the local interconnect 140 above the N contact 375, the left region in this instance. Before proceeding further, it should be noted that terms such as "upper", "lower", "top", "bottom", "left", "right", etc. are used for ease of description. Unless specifically indicated, these should not be taken to specify an absolute orientation. The second region 397 may be defined to be a region of the local interconnect 340 above the P contact 385 (the right region in this instance). The recess region 395 may be defined to be a region of the local interconnect 340 between the first and second regions 392, 397. With the regions so defined, the local interconnect 340 seen in FIG. 3A may be the recess region 395 of the local interconnect 340.

With the regions so defined, then the depths of the local interconnect 340 may also be referenced as follows. A "local interconnect N depth" may be a depth of the local interconnect 340 in the first region 392. A "local interconnect P depth" may be a depth of the local interconnect 340 in the second region 397. A "local interconnect recess depth" may be a depth of the local interconnect 340 in the recess region 395.

Unlike the conventional device 100, the local interconnect 340 of the device 300 has much shallower recess. That is, with the proposed device 300, the local interconnect recess depth may be less than the local interconnect N depth. Alternatively, or in addition thereto, the local interconnect recess depth may be less than the local interconnect P depth. Because of the reduced local interconnect recess depth, capacitive coupling with the active gates is significantly reduced, which can thus improve AC performance. In an aspect, a lower surface of the local interconnect 340 in the recess region 395 may be higher than a highest point of the N source/drain 370. Alternatively, or in addition thereto, the lower surface of the local interconnect 340 in the recess region 395 may be higher than a highest point of the P source/drain 380. The local interconnect recess depth may be in the range between 10-20 nm. Also, in the recess region 395, a height of the STI oxide 330 may be in the range between 10-100 nm.

In an aspect, the upper surface of the local interconnect 340 may be planar. In another aspect, upper surfaces of the STI oxide 330 and the N contact 375 in the first region 392 may be coplanar. Alternatively, or in addition thereto, upper surfaces of the STI oxide 330 and the P contact 385 in the second region 397) may be coplanar.

Figure 4A:
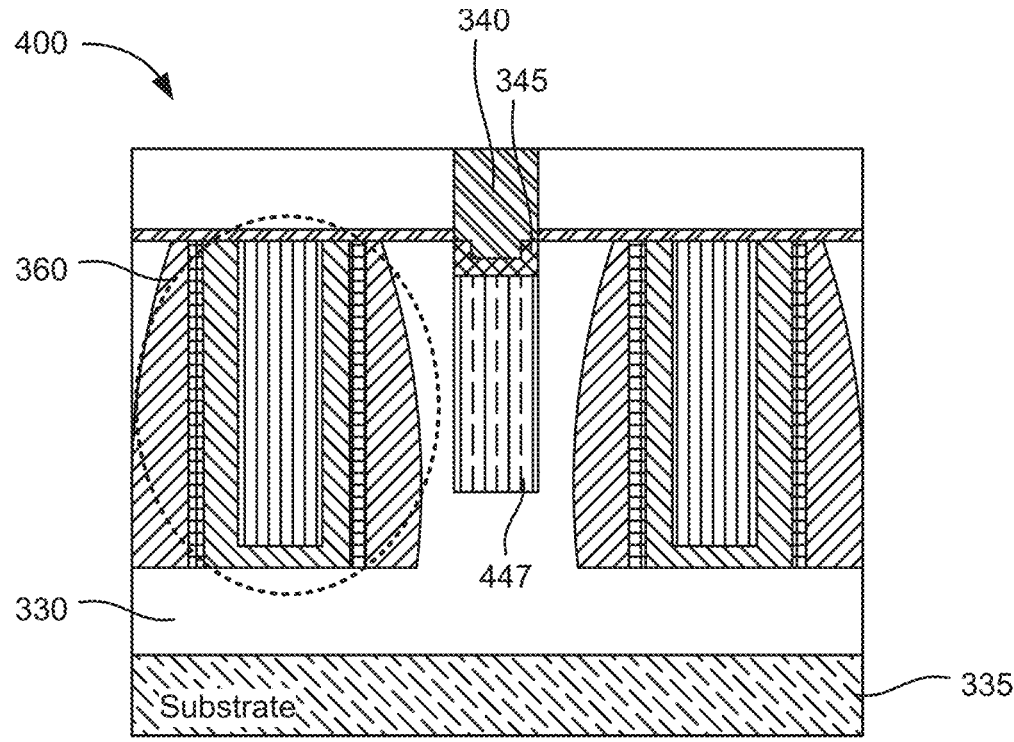
FIGS. 4A and 4B illustrate sectional views of another embodiment of a device with a local interconnect along the line X-X' and Y-Y' of FIG. 1, respectively, in accordance with at one or more aspects of the disclosure.
Figure 4B:
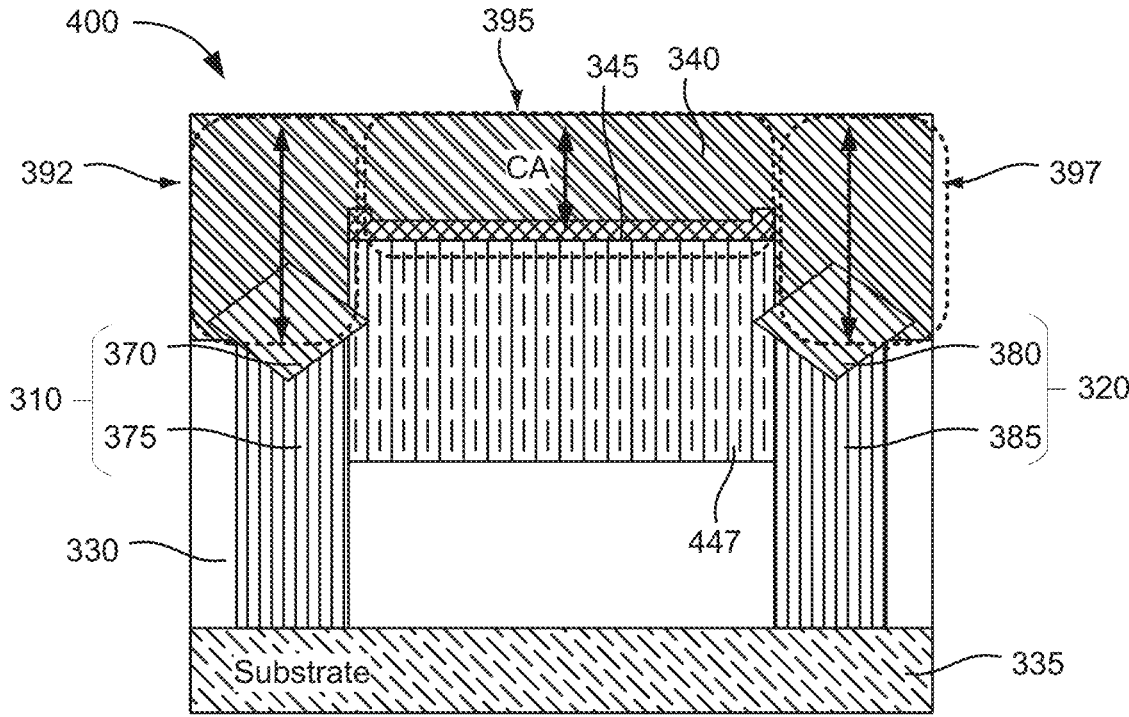

Additional steps may be taken to further reduce the coupling capacitance. FIGS. 4A and 4B illustrate sectional views of a device 400 with a local interconnect in accordance with one or more aspects of the disclosure. FIG. 4A illustrates a sectional view of the device 400 along the line X-X' of FIG. 1, and FIG. 4B illustrates a sectional view of the device 400 along the line Y-Y' of FIG. 1.

The device 400 may be similar to the device 300 of FIGS. 3A and 3B. One difference is that the device 400 may also include a low-k dielectric 447 formed between the local interconnect 340 and the substrate 335 in the recess region 395. The low-k dielectric 447 may be formed from materials that include silicon (Si), carbon (C), oxygen (O), and hydrogen (H), e.g., SiCOH.

In FIGS. 4A and 4B, note that there may still be some STI oxide 330 in the recess region 395. That is, the STI oxide 330 in the recess region 395 may be partially replaced with the low-k dielectric 447. In this instance, the low-k dielectric 447 may be formed on the STI oxide 330 in the recess region 395.

Figure 5A:
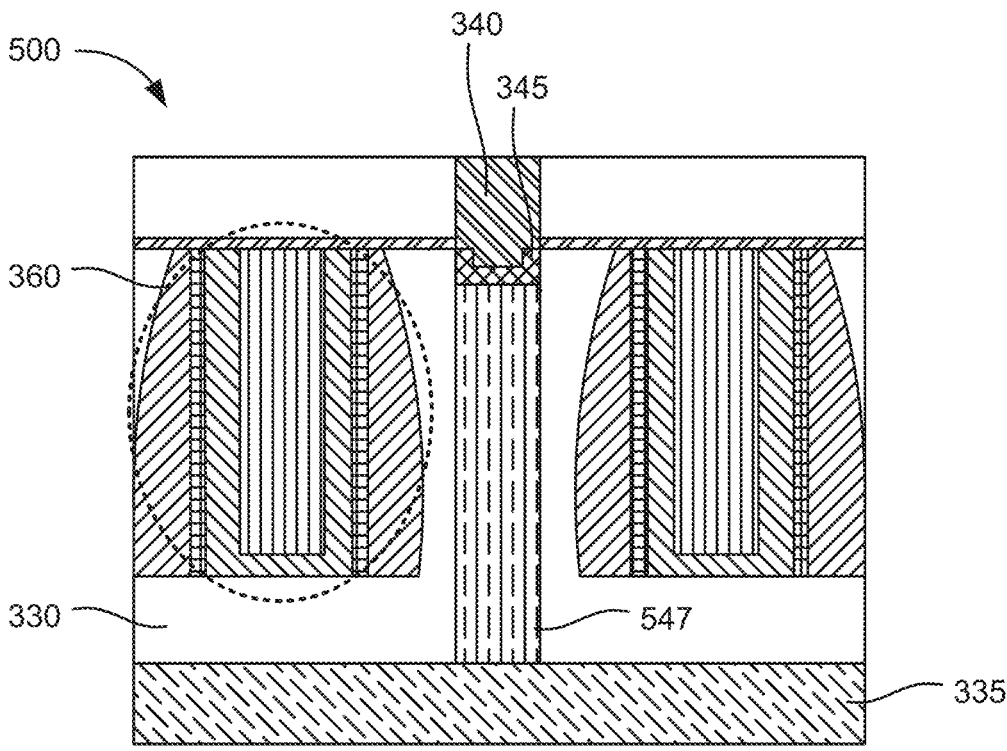
FIGS. 5A and 5B illustrate sectional views of a further embodiment of a device with a local interconnect along the line X-X' and Y-Y' of FIG. 1, respectively, in accordance with at one or more aspects of the disclosure.
Figure 5B:
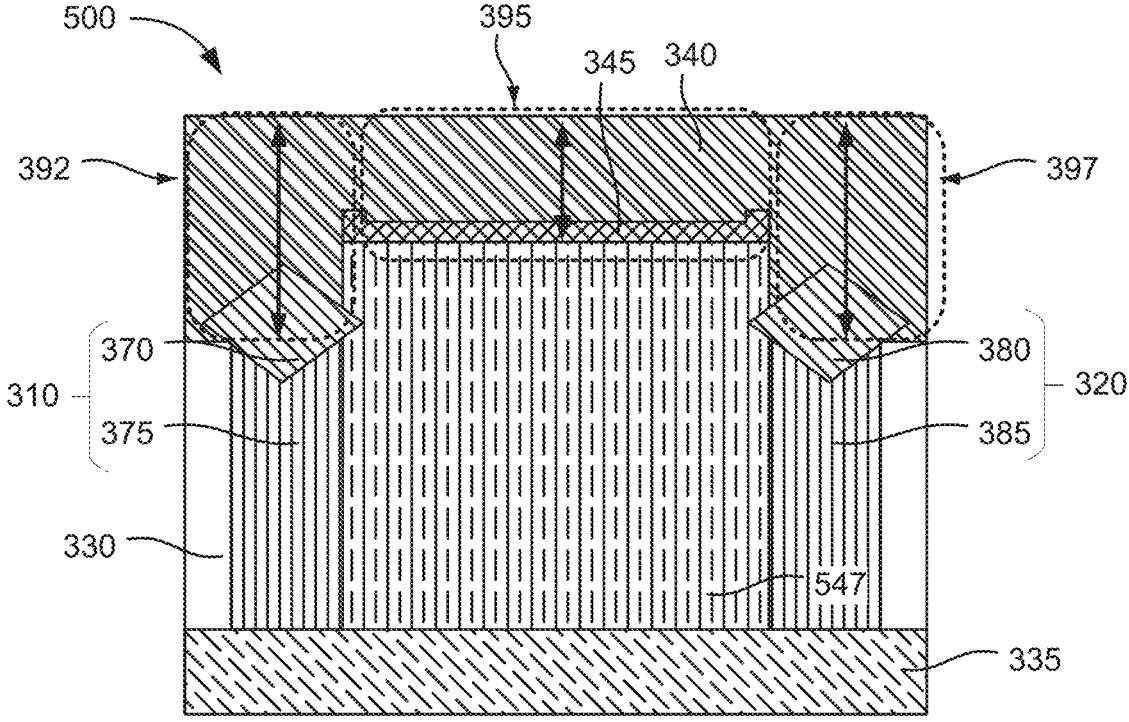

FIGS. 5A and 5B illustrate sectional views of a device 500 with a local interconnect in accordance with one or more aspects of the disclosure. FIG. 5A illustrates a sectional view of the device 500 along the line X-X' of FIG. 1, and FIG. 5B illustrates a sectional view of the device 500 along the line Y-Y' of FIG. 1.

The device 500 may be similar to the device 300 of FIGS. 3A and 3B. The device 500 may also be viewed as an extension of the device 400. Similar to the device 400, the device 500 in FIGS. 5A and 5B may also include a low-k dielectric 547 formed between the local interconnect 340 and the substrate 335 in the recess region 395. But in this instance, the STI oxide 330 in the recess region 395 may be fully replaced with the low-k dielectric 547. In this instance, the low-k dielectric 447 may be formed on the substrate 335 in the recess region 395. Thus, the devices 400 and 500 may represent a continuum of the size/height of the low-k dielectric that may be utilized.

Figure 6A:
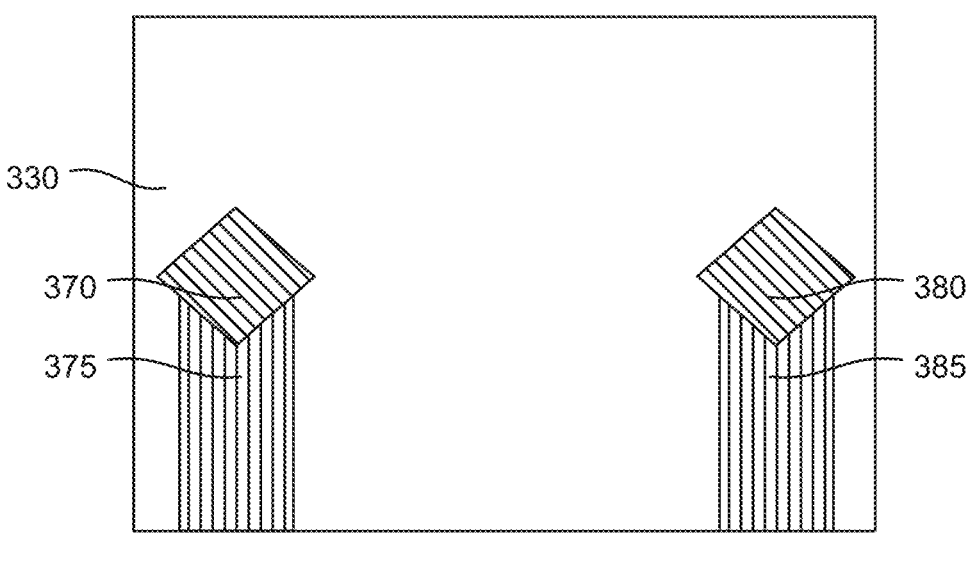
FIGS. 6A-6G illustrate examples of stages of fabricating a device of FIGS. 3A and 3B in accordance with at one or more aspects of the disclosure.

FIGS. 6A-6G illustrate examples of stages of fabricating a device with a local interconnect—such as the device 300—in accordance with at one or more aspects of the disclosure. FIG. 6A illustrates a stage in which STI oxide 330 may be filled on a substrate 335 (not shown) in these figures. The STI oxide may cover the N source/drain 370, the N contact 375, the P source/drain 380 and the P contact 385.

Figure 6B:
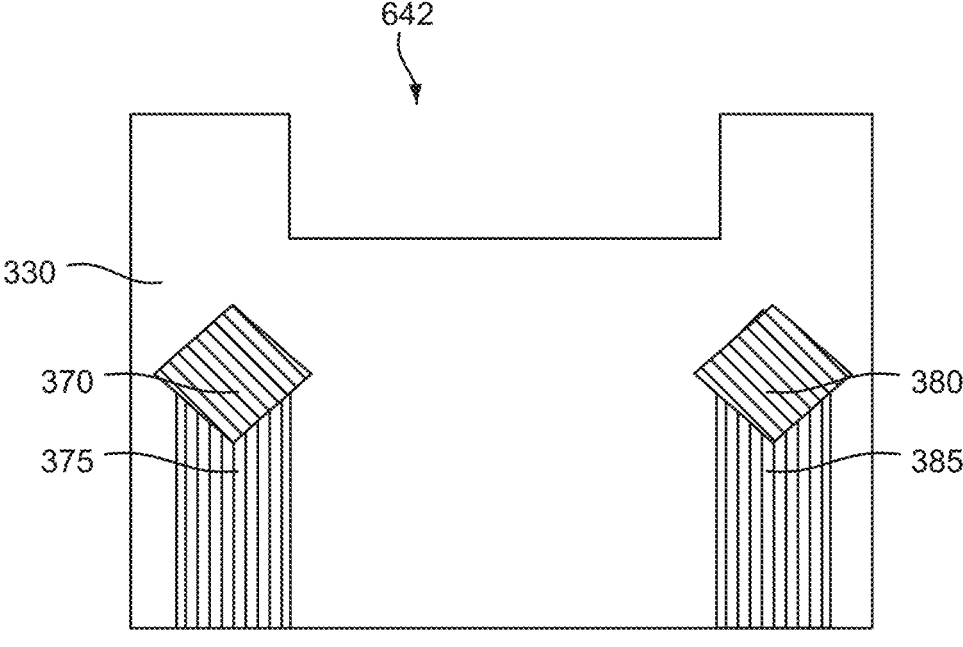

FIG. 6B illustrates a stage in which a recess 642 may be formed in the STI oxide 330. For example, a mask may be used to open the STI oxide 330. The recess 642 may correspond to the recess region 395. The depth of the recess 642 may range between 10-20 nm.

Figure 6C:
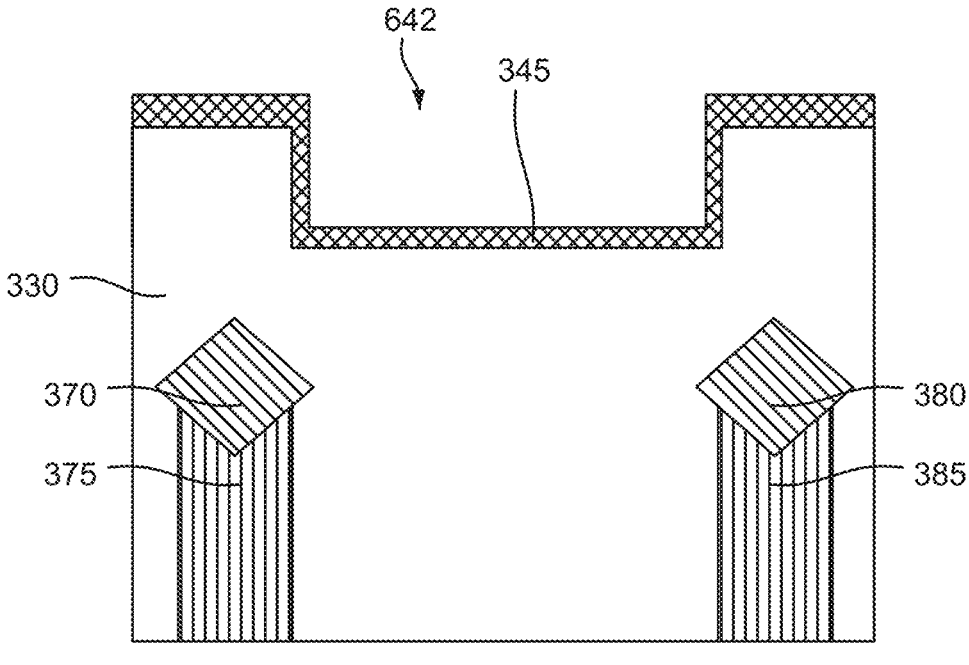

FIG. 6C illustrates a stage in which the etch stop layer 345 may be formed by depositing materials (e.g., SiN, SiCN, AlN, AlO, etc.). Conformal chemical vapor deposition (CVD) process may be used to deposit the etch stop layer 345.

Figure 6D:
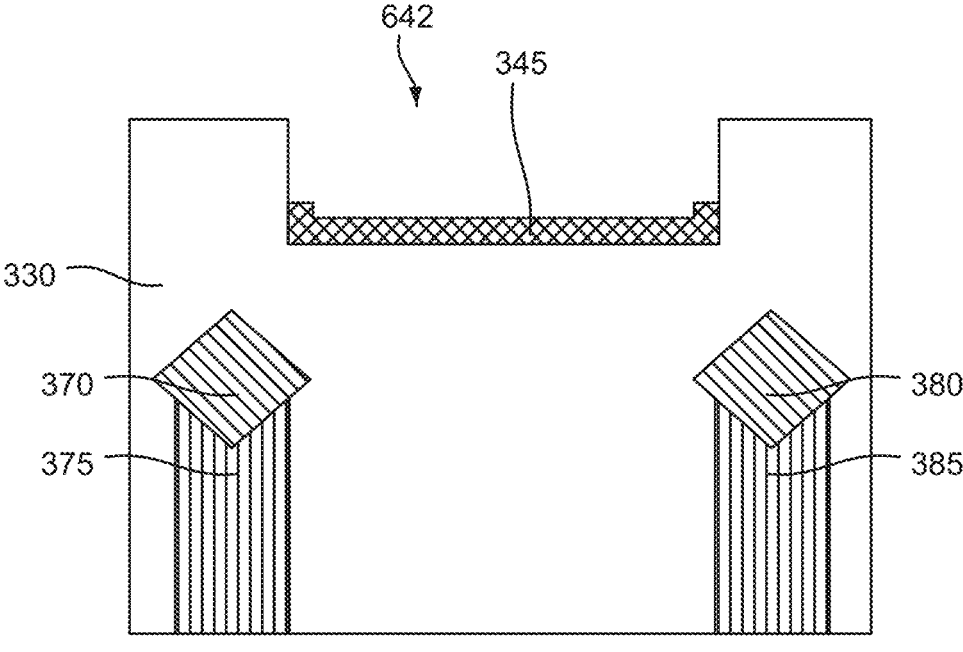

FIG. 6D illustrates a stage in which material of the etch stop layer 345 may be etched.

Figure 6E:
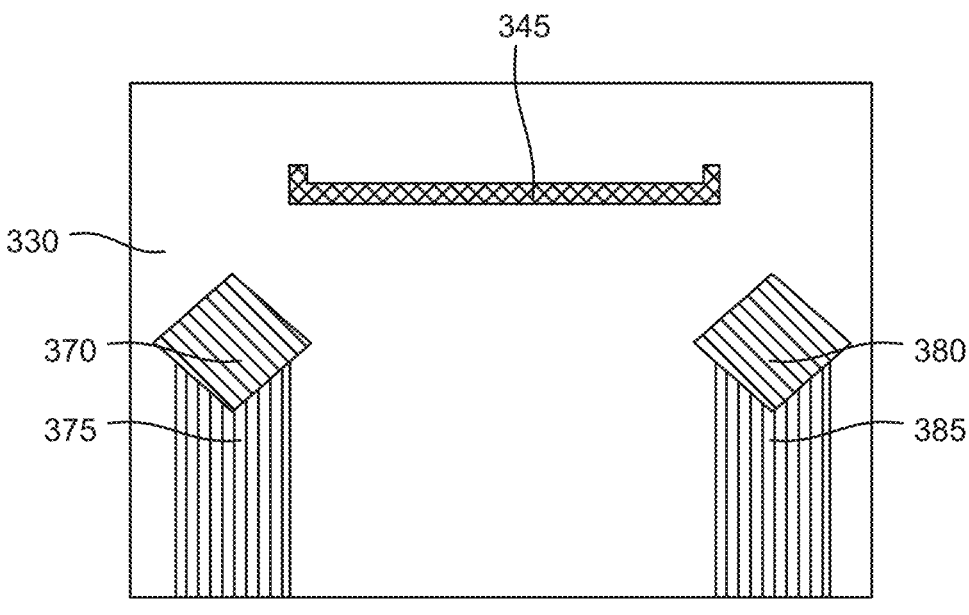

FIG. 6E illustrates a stage in which more material for the STI oxide 330 may be deposited, including in the recess 642. The deposited material may be polished, e.g., chemical-mechanical polishing (CMP).

Figure 6F:
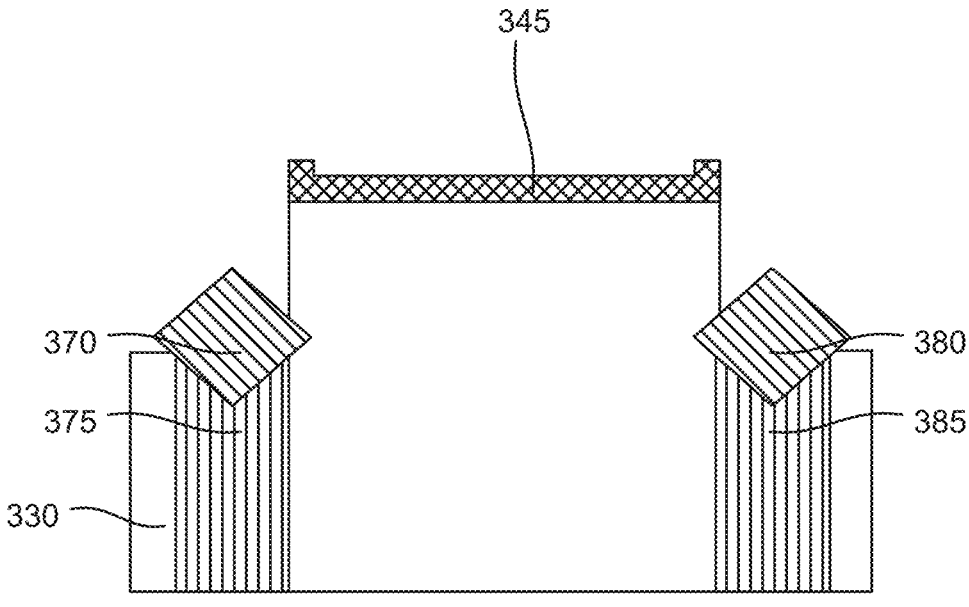

FIG. 6F illustrates a stage in which the STI oxide 330 may be etched to expose the N source/drain 370 and the P source/drain 380. The etch stop layer 345 may prevent etching of the STI oxide below the etch stop layer 345.

Figure 6G:
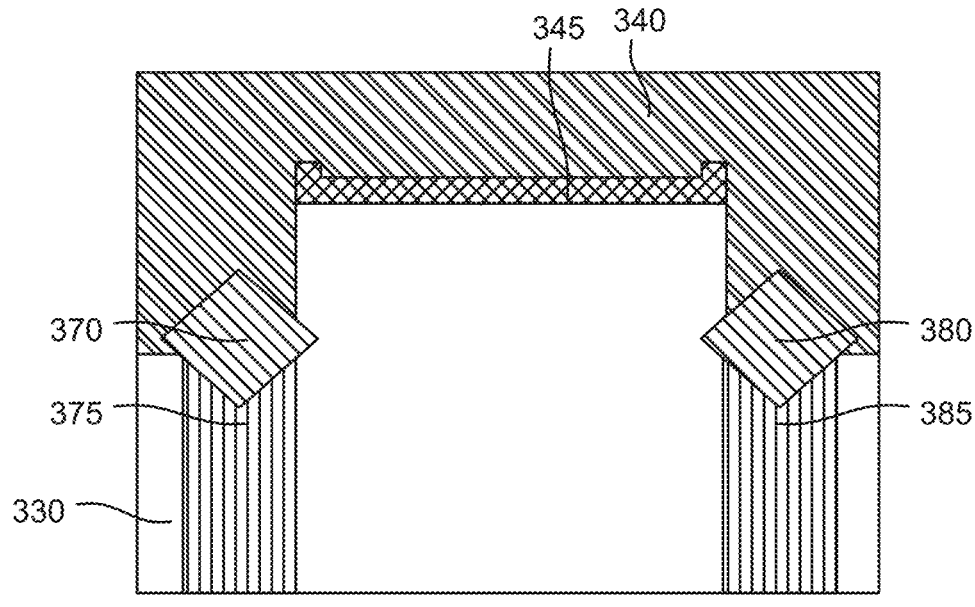

FIG. 6G illustrates a stage in which metal (e.g., W, Co, Ru, Ni, Nb, etc.) may be deposited to form the local interconnect 340.

Figure 7A:
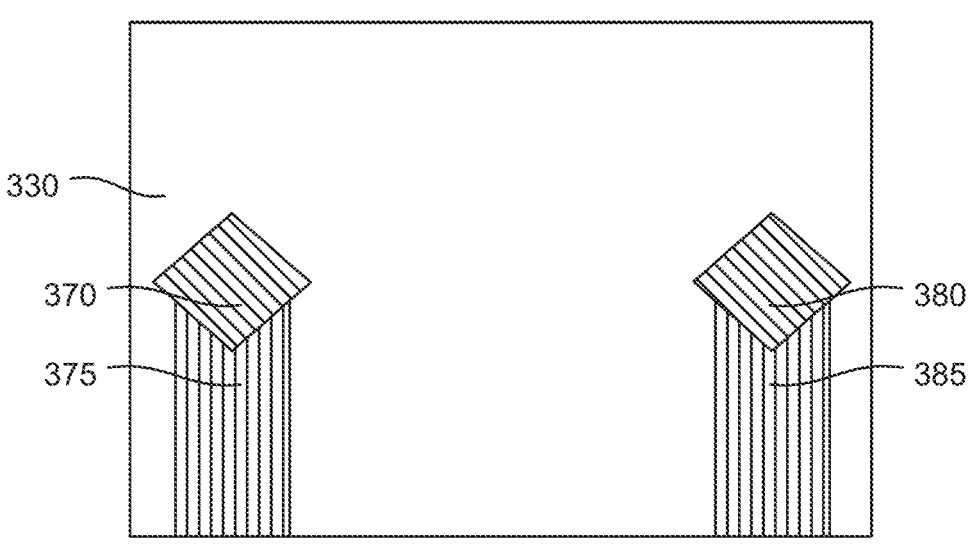

FIGS. 7A-7G illustrate examples of stages of fabricating a device with a local interconnect—such as the devices 400, 500—in accordance with at one or more aspects of the disclosure. FIG. 7A illustrates a stage in which STI oxide 330 may be filled on a substrate 335 (not shown) in these figures. The STI oxide may cover the N source/drain 370, the N contact 375, the P source/drain 380 and the P contact 385.

Figure 7B:
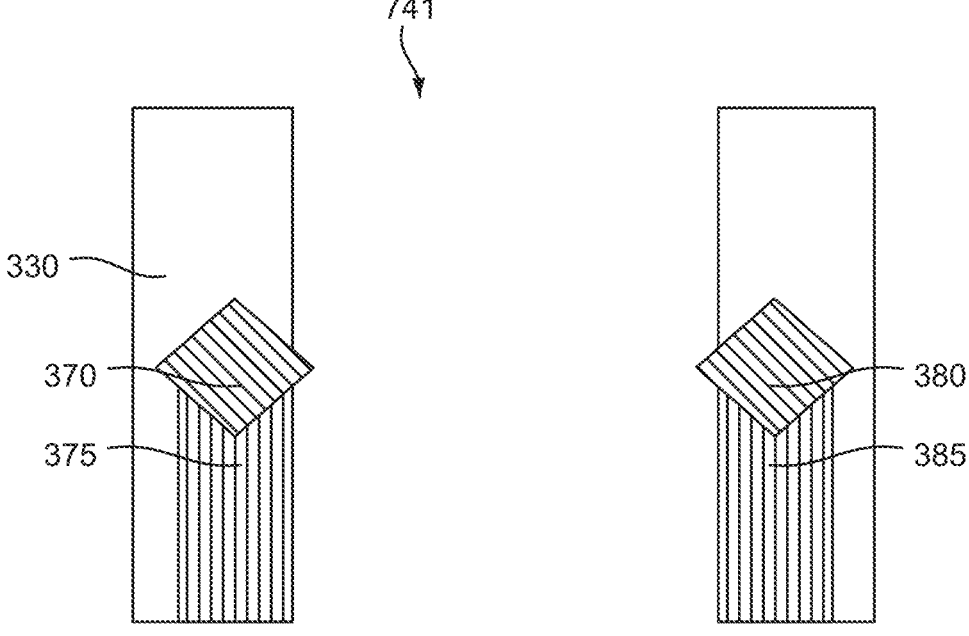

FIG. 7B illustrates a stage in which a full cavity 741 may be formed in the STI oxide 330. For example, a mask may be used to open the STI oxide 330. The full cavity 741 may correspond to the recess region 395.

Figure 7C:
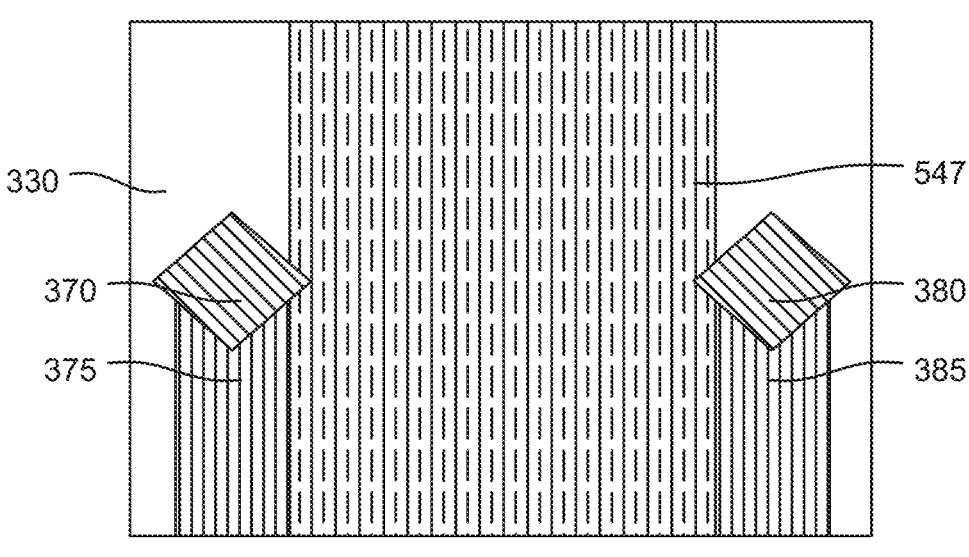

FIG. 7C illustrates a stage in which the cavity 741 is filled with a low-k dielectric material. The filled in dielectric material may be polished (e.g., CMP).

Figure 7D:
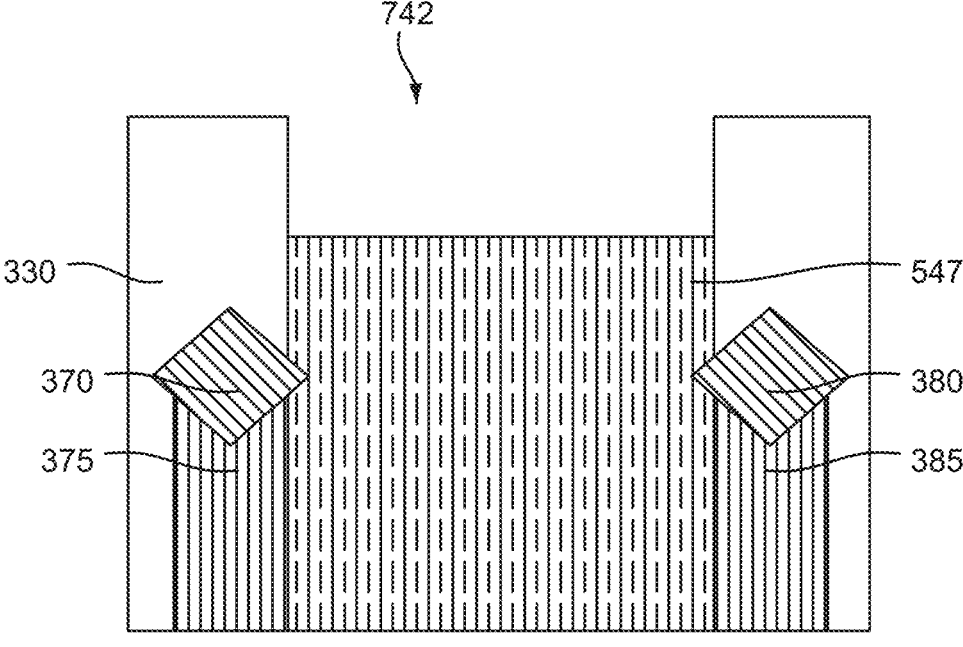

FIG. 7D illustrates a stage in which a recess 742 may be formed by partially etching a top portion of the low-k dielectric material and thus form the low-k dielectric 547. The depth of the recess 742 may range between 10-20 nm.

Figure 7E:
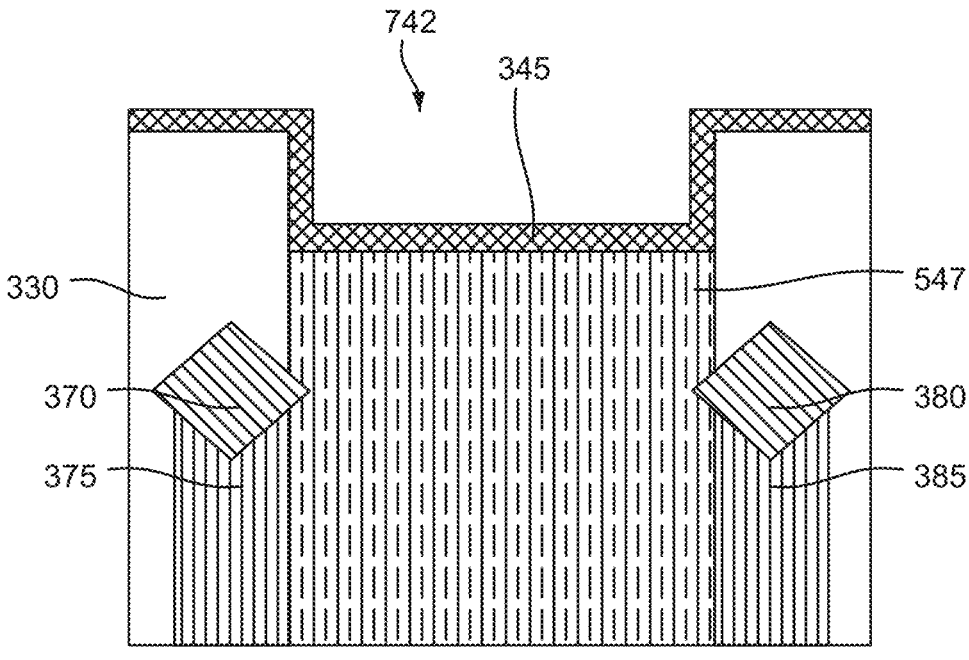

FIG. 7E illustrates a stage in which the etch stop layer 345 may be formed by depositing materials (e.g., SiN, SiCN, AlN, AlO, etc.). Conformal chemical vapor deposition (CVD) process may be used to deposit the etch stop layer 345.

Figure 7F:
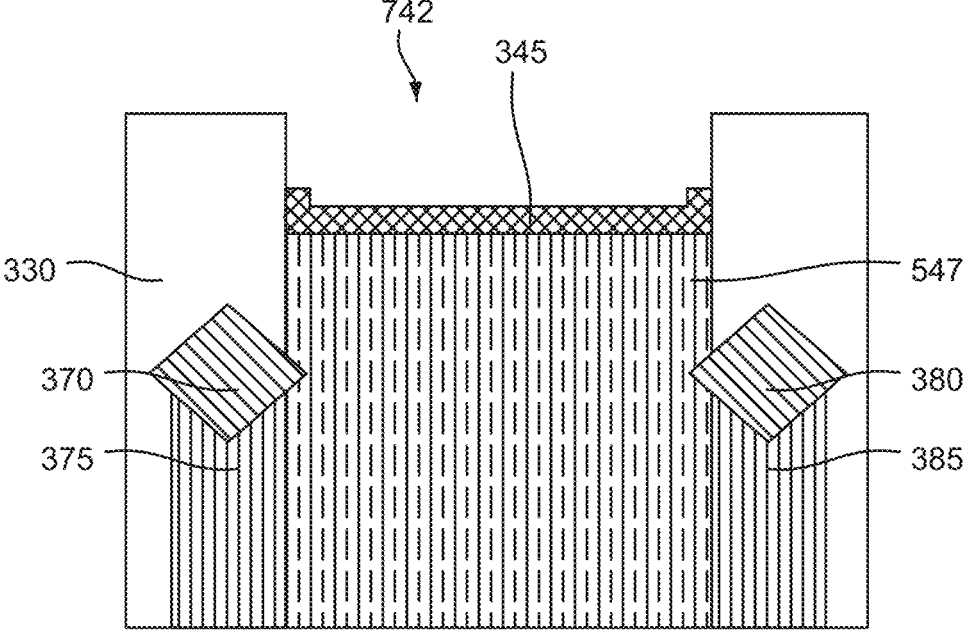

FIG. 7F illustrates a stage in which material of the etch stop layer 345 may be etched.

Figure 7G:
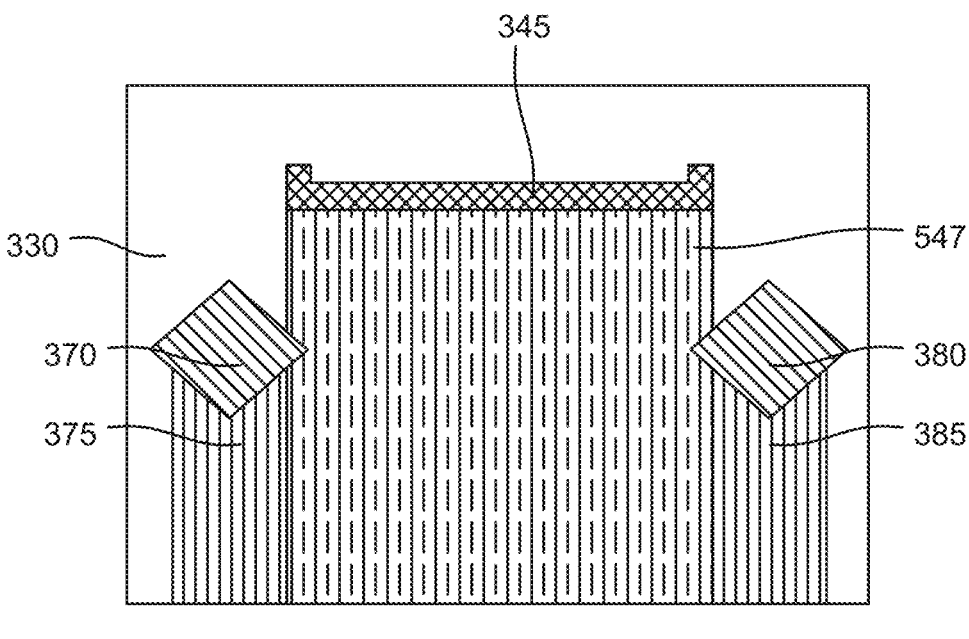

FIG. 7G illustrates a stage in which more material for the STI oxide 330 may be deposited, including in the recess 642. The deposited material may be polished, e.g., chemical-mechanical polishing (CMP).

Figure 7H:
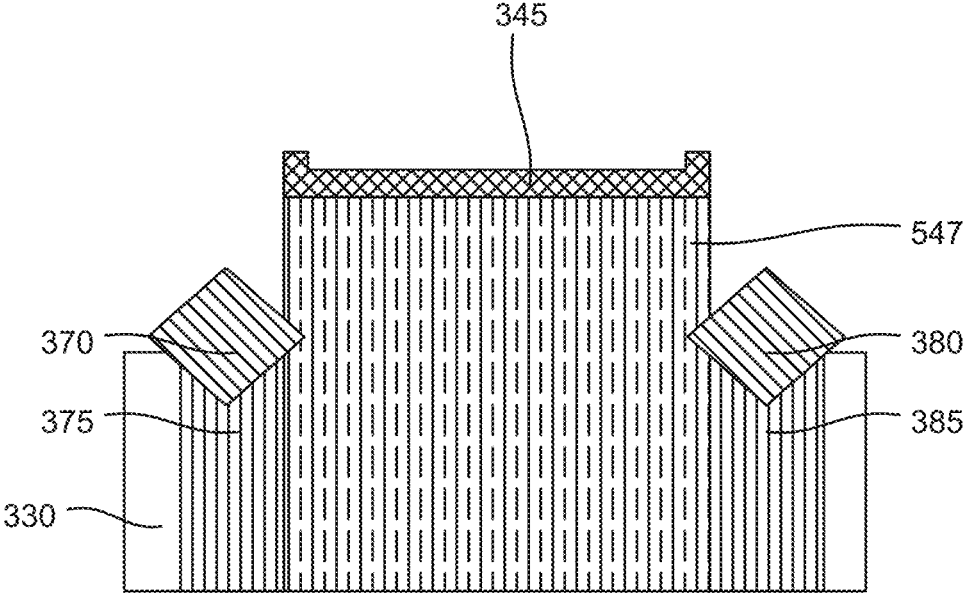
Figure 71:
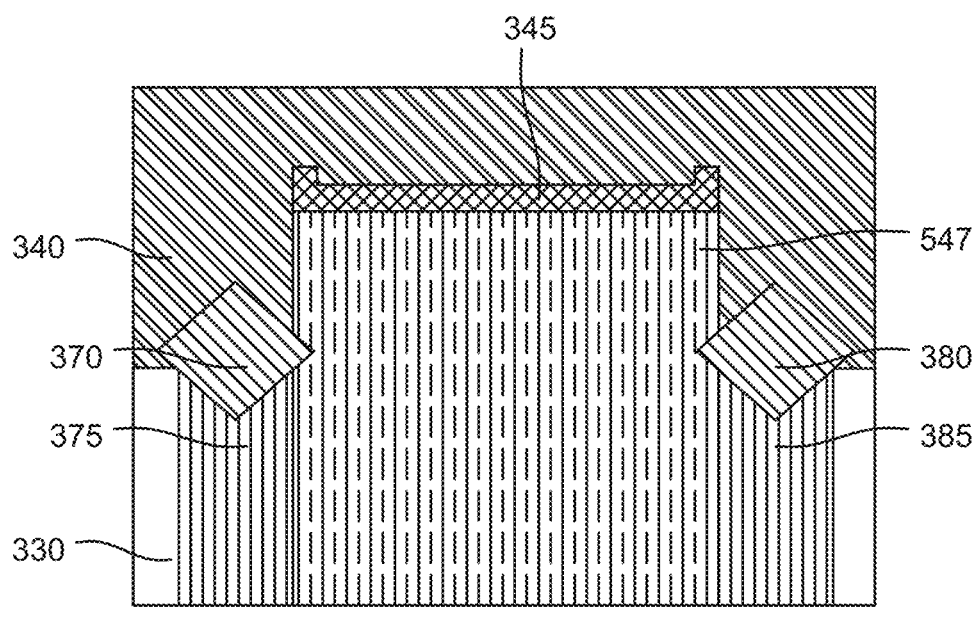

FIG. 7H illustrates a stage in which the STI oxide 330 may be etched to expose the N source/drain 370 and the P source/drain 380. The etch stop layer 345 may prevent etching of low-k dielectric 547.

FIG. 7I illustrates a stage in which metal (e.g., W, Co, Ru, Ni, Nb, etc.) may be deposited to form the local interconnect 340.

Note the following. While not shown in FIG. 7B, instead of etching the STI oxide 330 to form the full cavity 741, the STI oxide 330 may be partially etched. The remainder of the processes of stages 7C-7I may then be performed to fabricate the device 400.

FIG. 8 illustrates a flow chart of an example method 800 of fabricating a device with a local interconnect, such as the devices 300, 400, 500, in accordance with one or more aspects of the disclosure.

In block 810, an STI oxide 330 may be formed on a substrate 335. In an aspect, block 810 may correspond to the stages illustrated in FIGS. 6A, 7A.

In block 820, an N contact 375 may be formed within the STI oxide 330 and on the substrate 335 on a first side of the device 300, 400, 500. In an aspect, block 820 may correspond to the stages illustrated in FIGS. 6A, 7A.

In block 830, an N source/drain 370 may be formed on the N contact 375. In an aspect, block 830 may correspond to the stages illustrated in FIGS. 6A, 7A.

In block 840, a P contact 385 may be formed within the STI oxide 330 and on the substrate 335 on a second side of the device 300, 400, 500. In an aspect, block 840 may correspond to the stages illustrated in FIGS. 6A, 7A.

In block 850, a P source/drain 380 may be formed on the P contact 385. In an aspect, block 850 may correspond to the stages illustrated in FIGS. 6A, 7A.

In block 860, a local interconnect 340 may be formed on the STI oxide 330, the N source/drain 370, and the P source/drain 380. The local interconnect 340 may electrically couple the N source/drain 370 and the P source/drain 380. In aspect, block 860 may correspond to the stages illustrated in FIGS. 6G, 7I.

FIG. 9 illustrates a flow chart of an example method 900 of fabricating a device with a local interconnect, such as the devices 300, 400, 500, in accordance with at one or more aspects of the disclosure. FIG. 9 may be view as being more comprehensive than FIG. 8.

Block 910 may be similar to block 810. That is, in block 910, an STI oxide 330 may be formed on a substrate 335. In an aspect, block 910 may correspond to the stages illustrated in FIGS. 6A, 7A.

Block 920 may be similar to block 820. That is, in block 920, an N contact 375 may be formed within the STI oxide 330 and on the substrate 335 on a first side of the device 300, 400, 500. In an aspect, block 920 may correspond to the stages illustrated in FIGS. 6A, 7A.

Block 930 may be similar to block 830. That is, in block 930, an N source/drain 370 may be formed on the N contact 375. In an aspect, block 930 may correspond to the stages illustrated in FIGS. 6A, 7A.

Block 940 may be similar to block 840. That is, in block 940, a P contact 385 may be formed within the STI oxide 330 and on the substrate 335 on a second side of the device 300, 400, 500. In an aspect, block 940 may correspond to the stages illustrated in FIGS. 6A, 7A.

Block 950 may be similar to block 850. That is, in block 950, a P source/drain 380 may be formed on the P contact 385. In an aspect, block 950 may correspond to the stages illustrated in FIGS. 6A, 7A.

In block 953, a low-k dielectric 447, 547 may be formed between the local interconnect 340 and substrate 335 in the recess region. In an aspect, block 953 may correspond to the stages illustrated in FIGS. 7C, 7D.

In block 955, an etch stop layer 345 may be formed between the local interconnect 340 and the STI oxide 330 in the recess region 395. Alternatively, if low-k dielectric 447, 547 are present, then the etch stop layer 345 may be formed between the local interconnect 340 and the low-k dielectric 447, 547 in the recess region 395. In an aspect, block 955 may correspond to the stages illustrated in FIGS. 6C, 6D, 7E, 7F.

Block 960 may be similar to block 860. That is, in block 960, a local interconnect 340 may be formed on the STI oxide 330, the N source/drain 370, and the P source/drain 380. The local interconnect 340 may electrically couple the N source/drain 370 and the P source/drain 380. In aspect, block 960 may correspond to the stages illustrated in FIGS. 6G, 7I.

Figure 10:
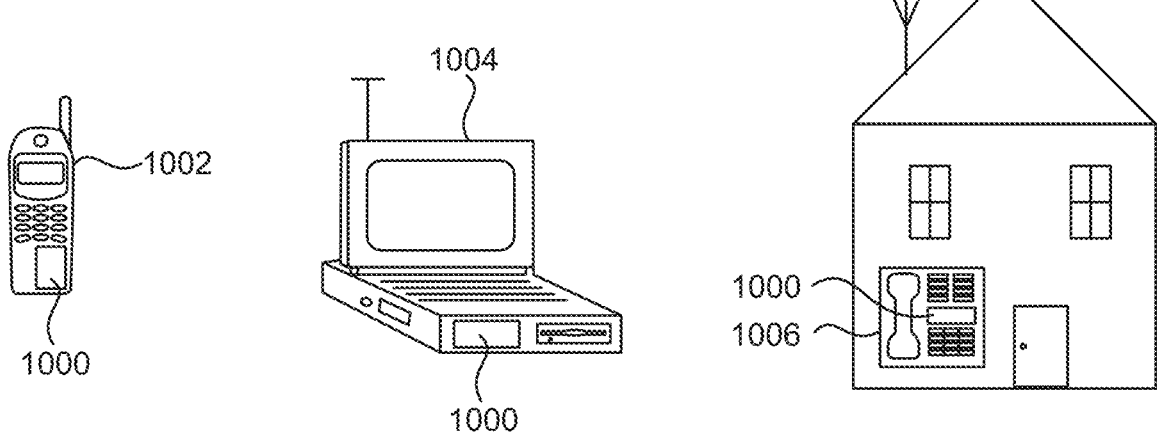
FIG. 10 illustrates various electronic devices which may utilize one or more aspects of the disclosure.

FIG. 10 illustrates various electronic devices 1000 that may be integrated with any of the aforementioned devices 300, 400, 500 in accordance with various aspects of the disclosure. For example, a mobile phone device 1002, a laptop computer device 1004, and a fixed location terminal device 1006 may each be considered generally user equipment (UE) and may include one or more devices (e.g., devices 300, 400, 500) as described herein. The devices 1002, 1004, 1006 illustrated in FIG. 10 are merely exemplary. Other electronic devices may also include the die packages including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

The foregoing disclosed devices and functionalities may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor die and packaged into an antenna on glass device. The antenna on glass device may then be employed in devices described herein.

Implementation examples are described in the following numbered clauses:

Clause 1: A device, comprising: a shallow trench isolation (STI) oxide formed on a substrate; an N contact formed within the STI oxide and on the substrate on a first side of the device; an N source/drain formed on the N contact; a P contact formed within the STI oxide and on the substrate on a second side of the device; a P source/drain formed on the P contact; and a local interconnect formed on the STI oxide, the N source/drain, and the P source/drain, the local interconnect electrically coupling the N source/drain and the P source/drain, wherein a local interconnect recess depth is less than a local interconnect N depth, or the local interconnect recess depth is less than a local interconnect P depth, or both, the local interconnect N depth being a depth of a first region of the local interconnect above the N contact, the local interconnect P depth being a depth of a second region of the local interconnect above the P contact, and the local interconnect recess depth being a depth of a recess region of the local interconnect in between the first and second regions.

Clause 2: The device of clause 1, wherein the local interconnect is formed from any one or more of tungsten (W), cobalt (Co), ruthenium (Ru), nickel (Ni), and niobium (Nb).

Clause 3: The device of any of clauses 1-2, wherein a lower surface of the local interconnect in the recess region is higher than a highest point of the N source/drain, wherein the lower surface of the local interconnect in the recess region is higher than a highest point of the P source/drain, or both.

Clause 4: The device of any of clauses 1-3, further comprising: an etch stop layer formed between the local interconnect and the STI oxide in the recess region.

Clause 5: The device of clause 4, wherein the etch stop layer is 'U' shaped.

Clause 6: The device of any of clauses 4-5, wherein the etch stop layer is formed from any one or more of silicon nitride (SiN), silicon carbon nitride (SiCN), aluminum nitride (AlN), and aluminum oxide ($Al_2O_3$).

Clause 7: The device of any of clauses 1-6, further comprising: a low-k dielectric formed between the local interconnect and the substrate in the recess region.

Clause 8: The device of clause 7, wherein the STI oxide is formed on the substrate in the recess region, and wherein the low-k dielectric is formed on the STI oxide in the recess region.

Clause 9: The device of clause 7, wherein the low-k dielectric is formed directly on the substrate in the recess region.

Clause 10: The device of any of clauses 7-9, further comprising: an etch stop layer formed between the local interconnect and the low-k dielectric in the recess region.

Clause 11: The device of any of clauses 1-10, wherein the device is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

Clause 12: A method of fabricating a device, the method comprising: forming a shallow trench isolation (STI) oxide on a substrate; forming an N contact within the STI oxide and on the substrate on a first side of the device; forming an N source/drain on the N contact; forming a P contact within the STI oxide and on the substrate on a second side of the device; and forming a P source/drain on the P contact; forming a local interconnect on the STI oxide, the N source/drain, and the P source/drain, the local interconnect electrically coupling the N source/drain and the P source/drain, wherein a local interconnect recess depth is less than a local interconnect N depth, or the local interconnect recess depth is less than a local interconnect P depth, or both, the local interconnect N depth being a depth of a first region of the local interconnect above the N contact, the local interconnect P depth being a depth of a second region of the local interconnect above the P contact, and the local interconnect recess depth being a depth of a recess region of the local interconnect in between the first and second regions.

Clause 13: The method of clause 12, wherein the local interconnect is formed from any one or more of tungsten (W), cobalt (Co), ruthenium (Ru), nickel (Ni), and niobium (Nb).

Clause 14: The method of any of clauses 12-13, wherein a lower surface of the local interconnect in the recess region is higher than a highest point of the N source/drain, wherein the lower surface of the local interconnect in the recess region is higher than a highest point of the P source/drain, or both.

Clause 15: The method of any of clauses 12-14, further comprising: forming an etch stop layer between the local interconnect and the STI oxide in the recess region.

Clause 16: The method of clause 15, wherein the etch stop layer is 'U' shaped.

Clause 17: The method of any of clauses 15-16, wherein the etch stop layer is formed from any one or more of silicon nitride (SiN), silicon carbon nitride (SiCN), aluminum nitride (AlN), and aluminum oxide ($Al_2O_3$).

Clause 18: The method of any of clauses 12-17, further comprising: forming a low-k dielectric between the local interconnect and the substrate in the recess region.

Clause 19: The method of clause 18, wherein the STI oxide is formed on the substrate in the recess region, and wherein the low-k dielectric is formed on the STI oxide in the recess region.

Clause 20: The method of clause 18, wherein the low-k dielectric is formed directly on the substrate in the recess region.

Clause 21: The method of any of clauses 18-20, further comprising: forming an etch stop layer between the local interconnect and the low-k dielectric in the recess region.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth® (BT), Bluetooth® Low Energy (BLE), IEEE 802.11 (Wi-Fi®), and IEEE 802.15.4 (Zigbee/Thread) or other protocols that may be used in a wireless communications network or a data communications network. Bluetooth® Low Energy (also known as Bluetooth® LE, BLE, and Bluetooth® Smart) is a wireless personal area network technology designed and marketed by the Bluetooth® Special Interest Group intended to provide considerably reduced power consumption and cost while maintaining a similar communication range. BLE was merged into the main Bluetooth® standard in 2010 with the adoption of the Bluetooth® Core Specification Version 4.0 and updated in Bluetooth® 5.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described herein can be configured to perform at least a portion of a method described herein.

It should be noted that the terms "connected." "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or one or more claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into one or more sub-actions or contain one or more sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A device, comprising:
a shallow trench isolation (STI) oxide formed on a substrate;
an N contact formed within the STI oxide and on the substrate on a first side of the device;
an N source/drain formed on the N contact;
a P contact formed within the STI oxide and on the substrate on a second side of the device;
a P source/drain formed on the P contact; and
a local interconnect formed on and in contact with the STI oxide, the N source/drain, and the P source/drain, the local interconnect electrically coupling the N source/drain and the P source/drain,
wherein a local interconnect recess depth is less than a local interconnect N depth, or the local interconnect recess depth is less than a local interconnect P depth, or both,
the local interconnect N depth being a depth of a first region of the local interconnect above the N contact,
the local interconnect P depth being a depth of a second region of the local interconnect above the P contact, and
the local interconnect recess depth being a depth of a recess region of the local interconnect in between the first and second regions.

2. The device of claim 1, wherein the local interconnect is formed from any one or more of tungsten (W), cobalt (Co), ruthenium (Ru), nickel (Ni), and niobium (Nb).

3. The device of claim 1,
wherein a lower surface of the local interconnect in the recess region is higher than a highest point of the N source/drain,
wherein the lower surface of the local interconnect in the recess region is higher than a highest point of the P source/drain, or
both.

4. The device of claim 1, further comprising:
an etch stop layer formed between the local interconnect and the STI oxide in the recess region,
wherein there is no etch stop layer between the local interconnect and the STI oxide in the first region or there is no etch stop layer between the local interconnect and the STI oxide in the second region or both.

5. The device of claim 4, wherein the etch stop layer is 'U' shaped.

6. The device of claim 4, wherein the etch stop layer is formed from any one or more of silicon nitride (SiN), silicon carbon nitride (SiCN), aluminum nitride (AlN), and aluminum oxide ($Al_2O_3$).

7. The device of claim 1, further comprising:
a low-k dielectric formed between the local interconnect and the substrate in the recess region.

8. The device of claim 7,
wherein the STI oxide is formed on the substrate in the recess region, and
wherein the low-k dielectric is formed on the STI oxide in the recess region.

9. The device of claim 7, wherein the low-k dielectric is formed directly on the substrate in the recess region.

10. The device of claim 7, further comprising:
an etch stop layer formed between the local interconnect and the low-k dielectric in the recess region.

11. The device of claim 1, wherein the device is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

12. A method of fabricating a device, the method comprising:
forming a shallow trench isolation (STI) oxide on a substrate;
forming an N contact within the STI oxide and on the substrate on a first side of the device;
forming an N source/drain on the N contact;
forming a P contact within the STI oxide and on the substrate on a second side of the device;
forming a P source/drain on the P contact; and
forming a local interconnect on and in contact with the STI oxide, the N source/drain, and the P source/drain, the local interconnect electrically coupling the N source/drain and the P source/drain,
wherein a local interconnect recess depth is less than a local interconnect N depth, or the local interconnect recess depth is less than a local interconnect P depth, or both,
the local interconnect N depth being a depth of a first region of the local interconnect above the N contact,
the local interconnect P depth being a depth of a second region of the local interconnect above the P contact, and
the local interconnect recess depth being a depth of a recess region of the local interconnect in between the first and second regions.

13. The method of claim 12, wherein the local interconnect is formed from any one or more of tungsten (W), cobalt (Co), ruthenium (Ru), nickel (Ni), and niobium (Nb).

14. The method of claim 12,
wherein a lower surface of the local interconnect in the recess region is higher than a highest point of the N source/drain,
wherein the lower surface of the local interconnect in the recess region is higher than a highest point of the P source/drain, or
both.

15. The method of claim 12, further comprising:
forming an etch stop layer between the local interconnect and the STI oxide in the recess region,
wherein there is no etch stop layer between the local interconnect and the STI oxide in the first region or there is no etch stop layer between the local interconnect and the STI oxide in the second region or both.

16. The method of claim 15, wherein the etch stop layer is 'U' shaped.

17. The method of claim 15, wherein the etch stop layer is formed from any one or more of silicon nitride (SiN), silicon carbon nitride (SiCN), aluminum nitride (AlN), and aluminum oxide ($Al_2O_3$).

18. The method of claim 12, further comprising:
forming a low-k dielectric between the local interconnect and the substrate in the recess region.

19. The method of claim 18, wherein the STI oxide is formed on the substrate in the recess region, and wherein the low-k dielectric is formed on the STI oxide in the recess region.

20. The method of claim 18, wherein the low-k dielectric is formed directly on the substrate in the recess region.

21. The method of claim 18, further comprising:

forming an etch stop layer between the local interconnect and the low-k dielectric in the recess region.

\* \* \* \* \*